(12) United States Patent
Tsang

(10) Patent No.: US 8,873,763 B2
(45) Date of Patent: Oct. 28, 2014

(54) PERCEPTION ENHANCEMENT FOR LOW-FREQUENCY SOUND COMPONENTS

(76) Inventor: Wing Hon Tsang, Hong Kong (HK)

( * ) Notice: Subject to any disclaimer, the term of this patent is extended or adjusted under 35 U.S.C. 154(b) by 753 days.

(21) Appl. No.: 13/171,476

(22) Filed: Jun. 29, 2011

(65) Prior Publication Data
US 2013/0003989 A1 Jan. 3, 2013

(51) Int. Cl.
*H03G 3/00* (2006.01)
*H03G 9/00* (2006.01)
*H03G 7/00* (2006.01)
*G10L 21/02* (2013.01)
*H03G 9/02* (2006.01)
*G10L 21/0388* (2013.01)
*G10L 21/0364* (2013.01)

(52) U.S. Cl.
CPC ............ *G10L 21/0205* (2013.01); *H03G 9/005* (2013.01); *H03G 9/025* (2013.01); *G10L 21/0388* (2013.01); *G10L 21/0364* (2013.01)
USPC .............................. 381/61; 381/102; 381/106

(58) Field of Classification Search
CPC .............. G10H 1/16; G10H 1/06; G10H 1/12
USPC ..................... 381/61, 102, 58, 94.2, 94.3, 106
See application file for complete search history.

(56) References Cited

U.S. PATENT DOCUMENTS 5,930,373 A 7/1999 Shashoua et al.
6,285,767 B1 9/2001 Klayman (Continued)

FOREIGN PATENT DOCUMENTS

CN 1584974 A1 2/2005
CN 1754204 A1 3/2006
CN 1957398 A1 5/2007

OTHER PUBLICATIONS

De Barbenza, C.M., Bryan, M.E., and Tempest, W., "Individual loudness functions," Journal of Sound and Vibration, vol. 11, pp. 399-419, Apr. 1970.

(Continued)

*Primary Examiner* — Paul S Kim
*Assistant Examiner* — Douglas Suthers
(74) *Attorney, Agent, or Firm* — Ella Cheong Hong Kong; Sam T. Yip

(57) ABSTRACT

This invention discloses a method and a plurality of compressive amplitude distortion units for enhancing the perceptibility of the low-frequency portion of a sound by introducing residue harmonics of low-frequency signal components into the sound, where the residue harmonics are generated by a nonlinear function emulating the middle-ear response of a human being. The low-frequency portion in the resultant sound is perceivable to a human listener even if this portion is removed from this sound. In one embodiment, a compressive amplitude distortion unit comprises: a low pass filter for extracting low-frequency components of the input sound signal; a compressive amplitude function processor for generating a harmonics-containing signal from the low-pass signal by a nonlinear function emulating the middle-ear response; a gain block for scaling the harmonics-containing signal such that the signal strength of the scaled harmonics-containing signal is in the same range as that of the initial low-pass signal; an adder for adding the input sound signal and the scaled harmonics-containing signal; and a high pass filter for removing the low-frequency signal components in the output sound signal while still including the residue harmonics. Based on the disclosed method, this invention also discloses two anti-piracy methods that utilize the absence of low-frequency signal components in a sound signal, one for convenient detection of an unauthorized copy of the processed sound signal, another one for discouraging people to make such an unauthorized copy.

17 Claims, 9 Drawing Sheets

(56) References Cited

U.S. PATENT DOCUMENTS

| | | |
|---|---|---|
| 6,410,838 B1 | 6/2002 | Takeuchi |
| 2004/0071297 A1* | 4/2004 | Katou et al. ............. 381/61 |
| 2006/0184359 A1 | 8/2006 | Holmes |

OTHER PUBLICATIONS

Aerts, J.R.M., and Dirckx, J.J.J., "Nonlinearity in eardrum vibration as a function of frequency and sound pressure," Hearing Research, vol. 263, pp. 26-32, 2010.

Search Report for "Method and apparatus to generate the perceptible low pitch frequency," SIPO, China, Jul. 19, 2010.

Guan, B., Gao, Y., and Yang, Y., "Design of multi-channel programmable sound generator," Chinese Journal of Electron Devices, vol. 29, No. 4, pp. 1110-1113, Dec. 2006.

Raed, A., Yin, J. and Song, S., "Compact sinusoidal representations of audio for scalable compression and time/pitch-scale modifications," Journal of South China University of Technology (Natural Science Edition), vol. 31, No. 7, pp. 22-27, Jul. 2003.

* cited by examiner

PERCEPTION ENHANCEMENT FOR LOW-FREQUENCY SOUND COMPONENTS

FIELD OF THE INVENTION

The present invention is related to processing of a sound signal. In particular, this invention is related to the modification of a sound signal such that even if the low-frequency portion (i.e., the bass portion) of the modified sound is absent, a human listener can still psychologically perceive the presence of such low-frequency portion during the listening of the modified sound.

BACKGROUND OF THE INVENTION

Music can be enjoyed live in front of the stage in a theatre. However, it is more common that one enjoys music through radios, televisions, DVD home theatres, MP3 players, multimedia personal computers, etc. In these entertainment devices, transducers such as loudspeakers, which convert electric signals into physical sound waves, are used to reproduce the music. However, the quality of music reproduction is typically poor in the low frequency portion so that there are continual demands for bass improvement. The quality problem is due to the physical limitations of the electro-acoustic transducer in dimension and structure. For instance, the pipe organ (Werkprinzip) requires use of an open pipe of length 32 feet (around 10 meters) to produce the C0 tone in 16.35 Hz as reported in Eargel, J. M., *Music, Sound, and Technology*, Second edition, Van Nostrand Reinhold, 1995, the disclosure of which is incorporated by reference herein. Therefore, it is difficult to satisfy the requirements for good low-frequency reproduction in small churches or in general applications.

There have been some techniques in the art to improve the low frequency response of music reproduction devices. In one example, the difficulty of smaller-size pianos with shorter strings to reproduce the C0 tone and other low frequency tones can be overcome by using strings that are thicker and stiffer, and that are stretched less tightly. However, it results in a certain degree of inharmonic distortion. In another example, a moving-coil loudspeaker can use a stronger magnetic field and a bass-reflex tube to extend its low frequency range to around ⅓ octave from its low cut-off frequency. This method has been employed in commercial products, e.g., in a product produced by TOA Corporation with model number SW-46S-UL2, which can provide a 30 Hz low frequency response using an 18 inch woofer and base-reflex design.

Owing to the cost and space of the bass implementation for pipe organs of small churches, a technique called "acoustic bass" was used and known as early as the 1700's. The organ manufacturers made two pipes sounding together to get lower notes. For instance, C4 and G4 pipes are used together to get the C3 note. A similar method can be applied to pianos with shortened strings.

Note that in the above-mentioned approach, the sound of the intended frequency is not present, but human listeners can still perceive the presence of this frequency. This phenomenon is known as the residue pitch effect, referred to also as the phenomenon of the missing fundamental. Moor, B. C. J., *An Introduction to the Psychology of Hearing*, Chapter 5, Fourth edition, Academic Press, 1997, provides background information of this phenomenon, the disclosure of which is incorporated by reference herein. Basically, the residue pitch effect is a psycho-acoustic effect in that the residue pitch (harmonics) of a tone can be perceived by human listeners as the presence of the fundamental frequency even if the fundamental frequency is missing or masked by other noise. The residue pitch effect has been used in U.S. Pat. No. 5,930,373 and U.S. Pat. No. 6,285,767 to enhance bass, resulting in the extension of the low cut-off frequency of a speaker by 1 to 1.5 octaves.

In U.S. Pat. No. 5,930,373, a method for introducing residue harmonics of low-frequency signal components into a sound signal is disclosed. In this method, the sound signal is partitioned into a high frequency signal and a low frequency signal. The low frequency signal is further partitioned into a number of signal components in different frequency bands. Residue harmonics are generated for each of these signal components. The residue harmonics are weighted and added to the original sound signal. In the generation of residue harmonics, this reference suggests that nonlinear transformation may be used.

In U.S. Pat. No. 6,285,767, a sound enhancement system that enhances the perception of low-frequency signal components in a sound signal is disclosed. In this patent, the fact that low-frequency signal components can give rise to harmonics generated by the nonlinearity of human ears is recognized. To emphasize the presence of these harmonics such that the original low-frequency signal components are more easily perceived, the disclosed sound enhancement system de-emphasizes the mid-frequency components originally in the sound by purposefully reducing their power levels.

In U.S. Pat. No. 6,410,838, a musical signal synthesizer for synthesizing complex musical sound waveforms rich in harmonics is disclosed. The waveforms are generated by means of a feedback loop and a simple nonlinearity is used to introduce the harmonics into the signal.

However, there remains a need in the art for improved methods for bass enhancement by incorporating human physiology into consideration. In one aspect, there is a need for improved methods that are based on the nonlinear response of the human ear to enhance the perception of bass frequencies. Music with bass enhancement by such improved methods has the advantage that it sounds more natural to human beings. In contrast, music enhanced by non-ear-based methods appears more artificial in perception. In another aspect, there is a need for improved methods that allow the removal of the low-frequency signal components in a sound but human listeners can still psychologically perceive the presence of such low-frequency signal components. The absence of low-frequency signal components implies that the bass quality achieved by a sound generator is nothing to do with the quality of the reproduced sound or music. Therefore, a cheaper sound generator can be used instead of a more-expensive, bass-enhanced sound generator, thereby lowering the material cost. Moreover, the removal of such signal components avoids human ears to duplicate generation of same or similar residue harmonics so that it can prolong the heavy-bass music listening time for human listeners with less demand on ears. Finally, removing the low-frequency portion is also a means for combating against unauthorized copying of the original sound signal via tapping an analog output of a device, while not degrading any sound quality in the bass content listening. The problem of unauthorized copying of a sound signal by tapping at the analog output of the device is known as the analog loophole problem.

SUMMARY OF THE INVENTION

The present invention discloses a method for enhancing the perceptibility of the low-frequency portion of a sound signal by means of a nonlinear function that emulates the middle-ear response of a human being. The resultant sound signal incorporates residue harmonics of the low-frequency signal components of the original sound signal. Upon reproduction of the resultant sound signal into the physical sound wave form, the low-frequency portion is perceivable to a human listener even when the low-frequency signal components are removed from the resultant sound signal.

The invention further discloses a plurality of compressive amplitude distortion units, each of which generates residue harmonics by nonlinear distortion of the low-frequency portion of a sound signal, wherein the input-output relationship of the nonlinear distortion is based on the middle-ear response of a human being. Even when the low-frequency portion is removed through filtering, a human listener who listens to the reproduced sound can perceive the original low-frequency portion due to the generated residue harmonics.

In addition, the present invention discloses two anti-piracy methods that utilize the absence of low-frequency signal components in a sound signal after the aforementioned processing, one for convenient detection of an unauthorized copy of the processed sound signal, another one for discouraging people to make such an unauthorized copy. These anti-piracy methods are for combating against the analog loophole problem.

DETAILED DESCRIPTION OF THE PREFERRED EMBODIMENTS

Figure 1:
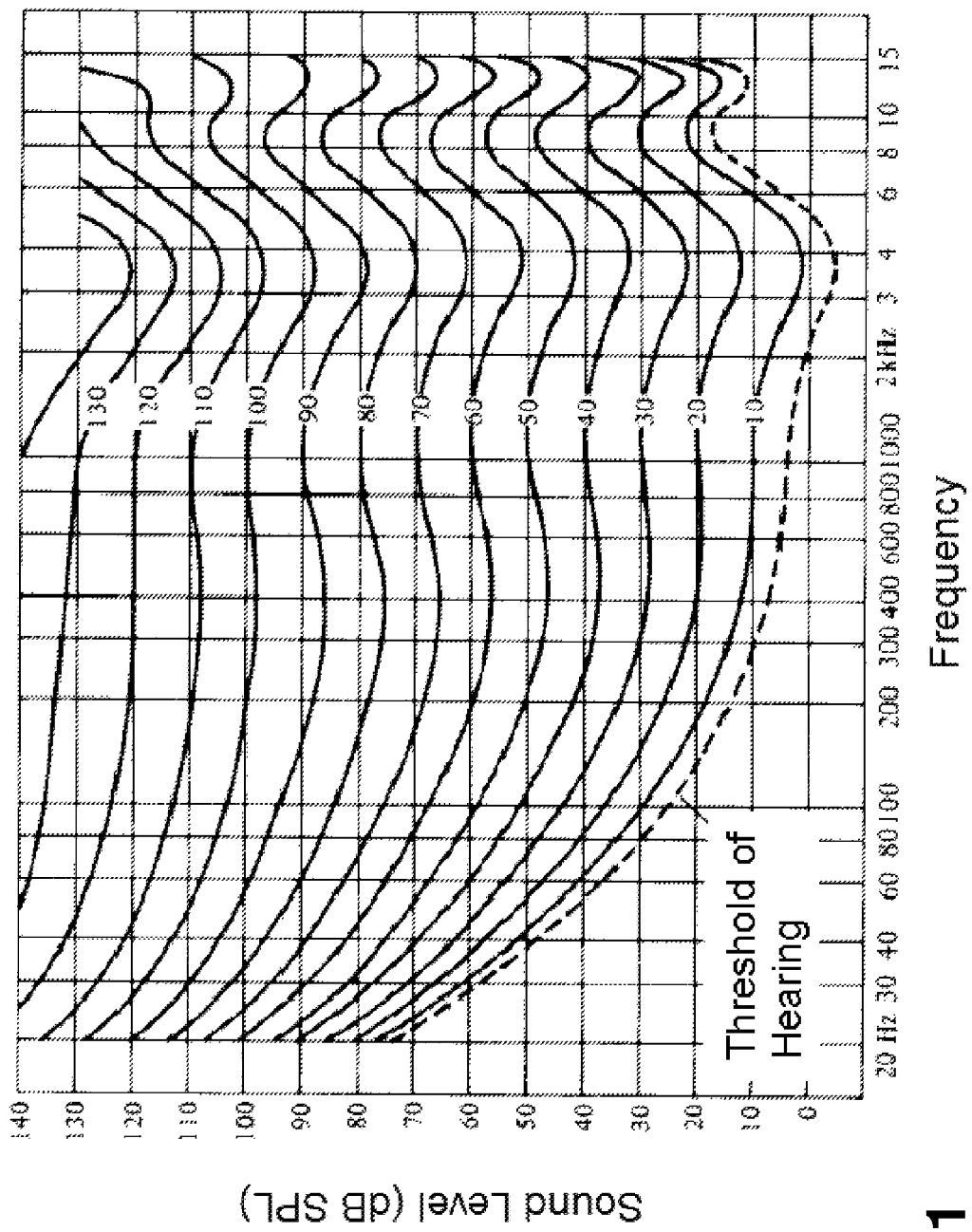
FIG. 1 shows equal loudness contours versus frequency of sound.

Human ears can judge the amplitude of the input sound pressure level (SPL). FIG. 1 is a graph showing the equal loudness contours versus frequency. Each contour indicates equal perceived loudness against a reference loudness level at 1 kHz. FIG. 1 demonstrates that a nonlinear response is present at both ends of the audible frequency band. The high frequency band from 1 kHz to 15 kHz shows a much higher consistency in the shift of the pressure level as the pressure level increases. The shift is quite independent of the pressure level in the high frequency range and the equal-loudness contour only varies within a +/−10 dB region, except in the cases of 110 dB and 120 dB. However, for the low frequency band from 20 Hz to 300 Hz, FIG. 1 indicates that human ears are quite inefficient in responding to low frequency as the required SPL is 10 dB at 1 kHz but increases to 78 dB at 20 Hz (68 dB difference). Nevertheless, the situation is better at a high loudness level. For example, a 100 dB sound at 1 kHz gives the same loudness for a 128 dB sound at 20 Hz (28 dB difference). Therefore, the perceptible response in that range depends on both frequency and amplitude, and the efficiency or sensitivity of perception is proportional to the input amplitude level.

In physiology, the structure of human auditory system consists of three major parts. The outer ear comprises the pinna, the concha and the canal. At the end of the outer ear is the eardrum that vibrates according to the received sound, creating pressure changes in the middle ear. The middle ear consists of three tiny bones (the malleus, the incures, and the stapes) for converting the air pressure into fluid motion from the eardrum to the inner ear via the oval window. In the inner ear, the cochlea with snail shell shape contains the basilar membrane, about 35 mm in length, attached one end on the oval window, balanced fluid pressure on both sides, and connected with about 30,000 nerve fibers.

The outer ear has a simple structure, comprising the pinna, the concha and the canal. The canal is only 2.5 mm in diameter, like a tuned port to collect sound energy from the air. Its frequency response is similar to a band-pass filter with a pass band from about 1 kHz to 6 kHz. At the end of the canal, there is an eardrum. The response of the whole outer ear is indifferent to different intensity levels of the sound.

The bones of the middle ear convert the air pressure into fluid motion from the eardrum to the inner ear via the oval window. The pressure on the oval window is increased by around 20 to 30 times with respect to the surface pressure of the eardrum, whose surface area is greater than that of the oval window. In the transfer of pressure, the bones do not magnify the pressure or movement. In contrast, the muscle on the malleus and the stapes involuntarily contracts to attenuate the level of sound entering into the inner ear when the incoming sound is intense (about 75 dB SPL) in the low frequency range, a phenomenon known as auditory reflex.

The basilar membrane is the key part of the inner ear. Its one end, called the base, is attached next to the oval window and the other end, which is called the apex, is freely suspended in fluid. The nerve sensors along the basilar membrane are dedicated to detecting sound energy of different frequencies, from high on the base to low on the apex. The input sound propagates from the base to the apex in a manner similar to a traveling wave. Each place on the basilar membrane is responsive to only one characteristic frequency with maximal vibration amplitude; this phenomenon supports the place theory. A description of the place theory is given in Plack, C. J., *The Sense of Hearing*, Lawrence Erlbaum Associations, Inc., 2005, the disclosure of which is incorporated by reference herein. Although the sensing is very nonlinear and complicated for different input levels and for different frequencies, up to now there is no evidence showing that it is more efficient to detect an intense low-frequency sound for supporting our perception of loudness. In the presence of very intense low-frequency sound, the place theory cannot explain that every place in the basilar membrane vibrates irrespective of the characteristic frequency, as indicated in Plack.

In the description that follows, it will be shown that the distortion of the intense low-frequency sound in the middle ear can help to enhance perception when the sound is below around a Half Loudness Frequency. The Half Loudness Frequency, as used herein, refers to an audible frequency at which a person perceives that the loudness level of this audible frequency is one half that of a reference frequency (e.g., 4 kHz). The Half Loudness Frequency depends on the individual. The major cause of inter-individual differences is probably psychological rather than physiological as reported by de Barbenza, C. M., Bryan, M. E., and Tempest, W., "Individual loudness functions," Journal of Sound and Vibration, volume 11, pages 399-419, April 1970, the disclosure of which is incorporated by reference herein. Although the Half Loudness Frequency can be any frequency, a rule of thumb is that it is usually between 150 Hz and 300 Hz. The type of distortion resulting from the intense low-frequency sound entering into the middle ear is termed "compressive amplitude distortion" in that it limits the dynamic range of the intense input sound according to the mechanism of the middle ear. The distortion generates overtones or residue harmonics of a fundamental frequency. The human auditory system can use any two consecutive harmonics of the sequence of residue harmonics to perceive the presence of the fundamental frequency. Therefore, the distortion generates additional information of the fundamental frequency in a more responsive band (between 300 Hz and 5 kHz) on the basilar membrane, allowing human listeners to perceive a low-frequency sound to be louder.

Figure 2:
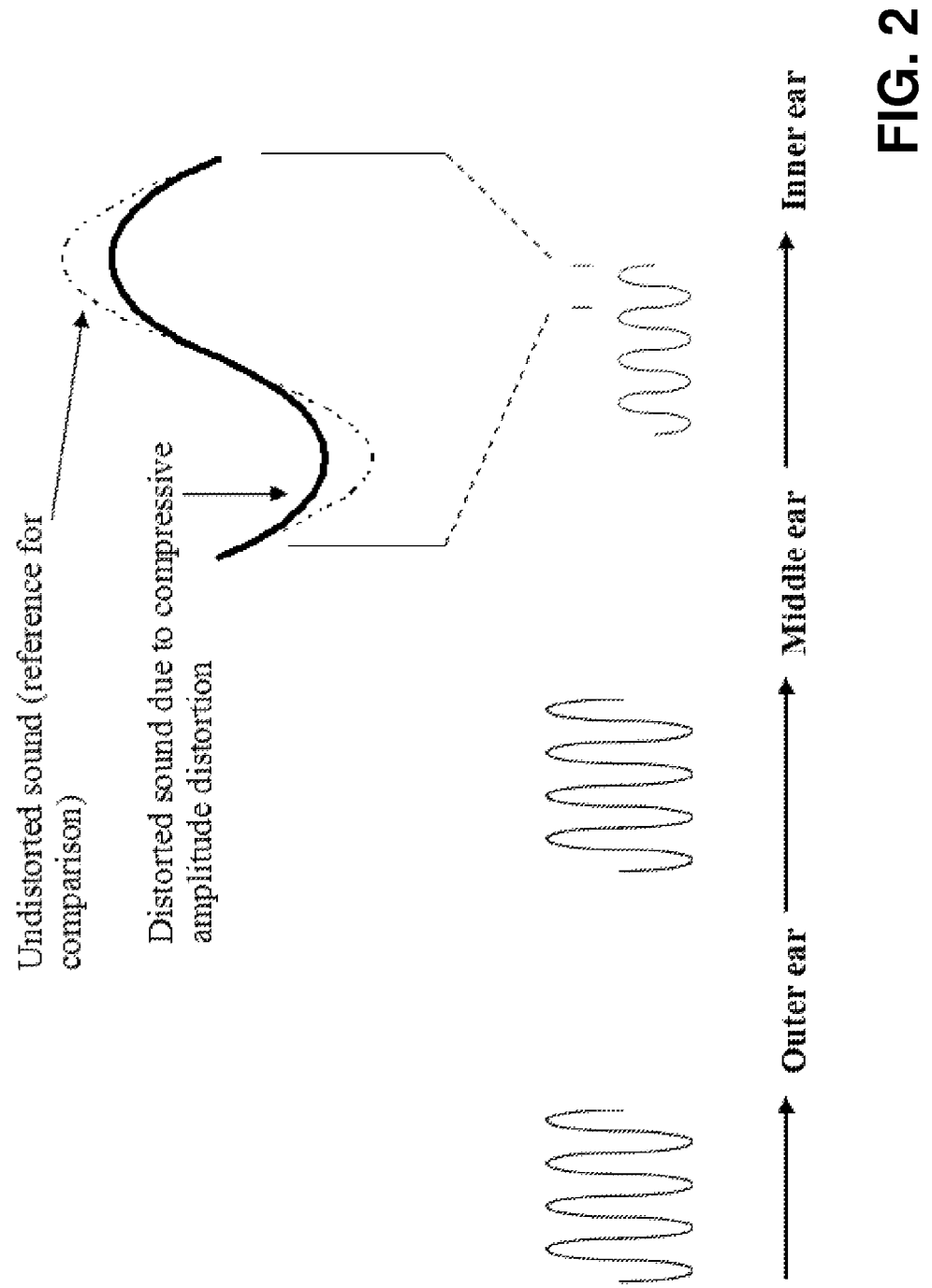
FIG. 2 shows compressive amplitude distortion generated by the middle ear.

FIG. 2 illustrates the compressive amplitude distortion generated by the middle ear. An intense low-frequency sound with over 75 dB SPL and with a single frequency below the Half Loudness Frequency is presented to the outer ear. The undistorted sound is passed to the middle ear. The muscle contracts so that compressive amplitude distortion is generated. The distorted sound is passed to the inner ear for frequency interpretation.

Figure 3:
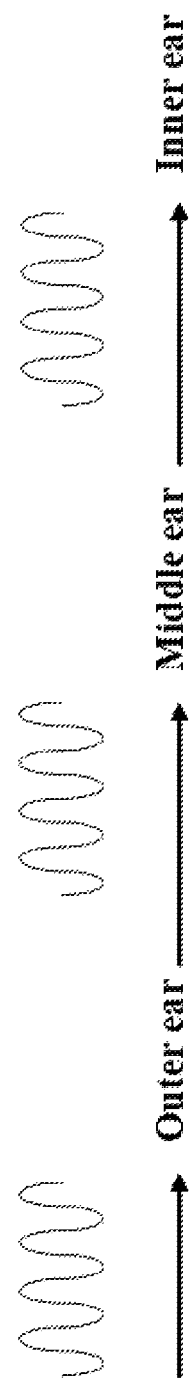
FIG. 3 illustrates the case in which a sound incorporating residue harmonics is presented to the ear of a listener.

It is possible to emulate the generation of residue harmonics for low-frequency signal components based on the same mechanism employed by the middle ear, i.e., compressive amplitude distortion, regardless of whether the low-frequency part of the sound is intense or not. This use is illustrated in FIG. 3. If the generated residue harmonics are intentionally added to the sound signal before it is presented to the outer ear of the listener, the resultant sound enables the listener to increase the perception of the low-frequency part of the sound. By the phenomenon of the missing fundamental, which has been described above, the listener is also able to perceive the presence of such low-frequency components even if the fundamental frequency is removed from the sound. This perception enhancement method is employed in the embodiments disclosed hereafter.

A first embodiment of the present invention is a method for enhancing the perceptibility of the low-frequency portion of a sound signal. Optionally, the sound signal may contain a direct-current (DC) component. Depending on the application, the sound signal can be represented in a suitable form appropriate for such application. Such suitable forms for representing the sound signal include, but are not limited to: an analog electrical signal; a digital signal; and a physical sound wave propagating in a medium such as air. In the disclosed method, the low-frequency signal components of the sound signal are first extracted. The signal that contains the extracted signal components is then processed by a nonlinear function with its input-output relationship emulating the middle-ear response of a human being. Residue harmonics are generated as a result, and are incorporated in the output signal of the nonlinear function. This output signal also contains the extracted low-frequency signal components. The amplitude of this output signal is adjusted such that the power of the signal after adjustment is in the same range as the power of the signal presented to the nonlinear function. The amplitude-adjusted signal is then added to the original sound signal, followed by filtering out all the low-frequency signal components. Enhanced perceptibility is obtained for the low-frequency portion of the resultant signal. Even if this portion is removed from the resultant signal, a human listener can still perceive the presence of such low-frequency portion in the reproduced sound.

The nonlinear function emulates the middle-ear response. Denote $w(u)$ as the output of the nonlinear function for an input $u$, and $f(x)$ as the amplitude of the middle-ear response for an input sound with amplitude $x$. As indicated above, it is intended to generate the residue harmonics in the nonlinear function regardless of whether the low-frequency part of the sound is intense or not. Therefore, $w(u)$ is given by $$w(u) = A \cdot f(u/B) \quad \text{(EQN. 1)}$$

where A is a factor determining the output range of the nonlinear function, and B is another factor determining the input value u where nonlinear distortion is prominent and residue harmonics are generated. The value of A provides a gain to the nonlinear function and hence does not affect the range of u where prominent nonlinear distortion occurs. It can be determined according to, e.g., the range of output values acceptable to the post-processing functions connected to this nonlinear function. The determination of B is illustrated by the following example. Suppose that residue harmonics are generated in the middle ear for an input sound pressure of 75 dB SPL (corresponding to $x = 10^{75/20} \times$ threshold sound pressure). It is now intended that the nonlinear function generates residue harmonics at a reference condition of $u=1$, which corresponds to the condition that the input sound pressure is, say, 30 dB SPL. Then B is set to $B = 10^{-75/20}$.

The middle-ear response used to develop the input-output relationship of the nonlinear function can be determined experimentally by, e.g., the method given in Aerts, J. R. M., and Dirckx, J. J. J., "Nonlinearity in eardrum vibration as a function of frequency and sound pressure," Hearing Research, Volume 263, Pages 26-32, 2010, the disclosure of which is incorporated by reference herein.

Alternatively, the middle-ear response can be mathematically determined by theoretical means. From EQN. 1, it is seen that the nonlinear function differs from the middle-ear response only by a factor and a scaling of the input. It follows that, apart from a physical middle-ear response, the nonlinear function can also be obtained from a prototype middle-ear response, which embeds the essential feature of the physical response, i.e., compressive amplitude distortion, but exhibits this distortion at a certain reference condition, e.g., $x=1$. It is first observed that the amplitude of sound can take on a positive or a negative value, depending on the direction of the sound wave's force acting on the middle ear. Therefore, a function to model a prototype middle-ear response is a two-sided function having a property of symmetry. Hence, $f(x)$ is given by $$f(x) = \begin{cases} g(x) & \text{if } x \geq 0 \\ -g(-x) & \text{if } x < 0 \end{cases} \quad \text{(EQN. 2)}$$

where $g(x)$, for x positive or zero, is a non-negative function. Since the muscle on the malleus and the stapes contracts in order to reduce the level of sound when the incoming sound signal is intense, the sound amplitude is compressed. This compression implies that $g(x)$ exhibits such a compression property. That is, the slope or steepness of $g(x)$ decreases as x increases. Functions suitable to be used for $g(x)$ include the following examples. One example is a clipping function, in which $g(x)$ is given by $$g(x) = \begin{cases} x & \text{for } 0 \leq x < 1 \\ 1 & \text{for } x \geq 1 \end{cases}$$

in which x=1 is the reference condition that clipping occurs. Another example is that g (x) is given by an inverse tangent function, i.e., $g(x) = \arctan(x)$.

Yet another example is based on an exponential function:

$g(x) = 1 - \exp(-x)$.

An additional example is a logarithmic function, namely, $g(x) = \ln(1+x)$  (EQN. 3)

where ln is the natural logarithmic function. In particular, using the function given by EQN. 3 is advantageous as explained as follows. Expanding ln(1+x) as an infinite series yields $$\ln(1+x) = x - \frac{x^2}{2} + \frac{x^3}{3} - \frac{x^4}{4} + \frac{x^5}{5} - \ldots$$

It indicates that adjacent residue harmonics generated by an input x are out of phase with a phase difference of 180 degrees. Having an alternate out-of-phase pattern for successive residue harmonics, regardless of whether the residue harmonics appear in only odd, even or whole integer order, has the following advantages.

1. Minimum spectral energy increments can be obtained after the residue harmonics are mixed with the original complex sound signal.
2. The adjacent harmonic is easily distinguished by a phase lock loop mechanism of the auditory nerve, especially for the higher-frequency harmonics. For an explanation on the phase lock loop mechanism, see Plack, incorporated by reference above.
3. Two or three consecutive harmonics are enough for the detection of the fundamental frequency in a complex tone (as reported in Moor) if the pattern matching mechanism with frequency template along the basilar membrane works for the auditory nerve; it is facilitated by the phase lock loop mechanism.
4. It produces reasonable resultant residue harmonics if the fundamental frequency and its harmonic frequencies are below the Half Loudness Frequency.

Herein, a middle-ear response with f(x) given by EQN. 2 in which g(x) is given by EQN. 3 is referred to as a middle-ear response characterized by a two-sided logarithmic function.

Additional embodiments of the present invention are a compressive amplitude distortion unit and a variant thereof.

Figure 4:
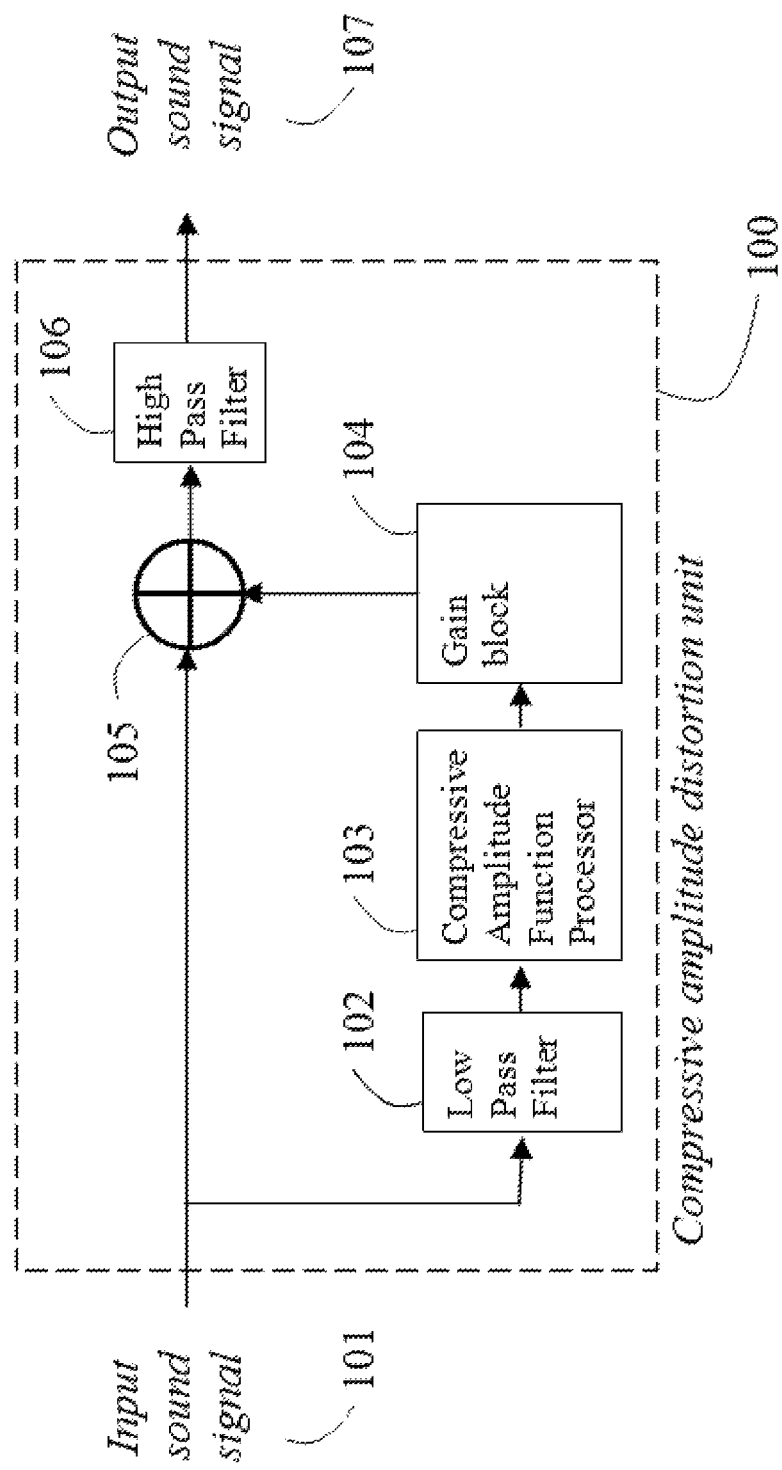
FIG. 4 depicts a block diagram of a compressive amplitude distortion unit according to the present invention.

A compressive amplitude distortion unit disclosed herein is illustrated with the aid of FIG. 4. The compressive amplitude distortion unit 100 processes an input sound signal 101 and generates an output sound signal 107. The input sound signal 101 is processed by a low pass filter 102 to produce a low-pass signal in such a way that the frequency components of the low-pass signal are substantially from zero Hz to a Half Loudness Frequency. Hence, the low-pass signal contains a plurality of low-frequency signal components of the input sound signal 101. The low-pass signal is processed by a compressive amplitude function processor 103, which uses a nonlinear function that emulates the middle-ear response of a human being. Because of the nonlinearity, processor 103 generates residue harmonics for a plurality of low-frequency signal components of an input sound signal. Some residue harmonics extend to the more easily aurally perceptible region of 300 Hz to 5 kHz. One feature of the embodiment is that the input-output relationship of the compressive amplitude function processor 103 emulates the middle-ear response of a human being. The output of the compressive amplitude function processor 103 is a harmonics-containing signal. It is noted that the harmonics-containing signal contains not only the residue harmonics but also the plurality of original low-frequency signal components typically at a power level different from that of the low-pass signal. A gain block 104 is then used to provide gain to the harmonics-containing signal, thereby producing a scaled harmonics-containing signal. The gain is selected such that the signal strength of the scaled harmonics-containing signal is in the same range as that of the low-pass signal. The scaled harmonics-containing signal and the input sound signal 101 are added together by an adder 105 to produce an adder output. The purpose of this addition is to introduce residue harmonics into the input sound signal. Although the adder output contains a double copy of the original low-frequency components of the input sound signal 100, these doubled low-frequency components are removed by a high pass filter 106. The high pass filter 106, which receives the adder output as the input, retains only the frequency components substantially above the Half Loudness Frequency in the output, such as the added harmonics from processor 103. The purpose of removing the original low-frequency components is four-fold. First, it avoids generation of the same or similar residue harmonics, such as those added by processor 103, in the middle ear from the original low-frequency components; the presence of the same or similar residue harmonics causes uncomfortable sound perception for the listener. As an additional advantage, human listeners can enjoy listening to the heavy-bass music for a longer time as the ears are relieved from the need to contract their muscle for residue-harmonics generation. Second, removing the low-frequency components means that any post-processing of the sound signal, e.g., power amplification for driving a loudspeaker, is less power consuming, thereby providing a practical advantage to many power-sensitive electronic devices such as portable music players. Third, removing the low-frequency components implies that the use of an expensive, bass-enhanced sound generator to generate the sound is unnecessary, so that a cheaper sound generator can be used, which reduces the cost. Fourth, removing the low-frequency portion is also a method for combating against the analog loophole problem, although it does not sacrifice any sound quality in the bass content listening. The output of the high pass filter 106 is the output sound signal 107.

Figure 5:
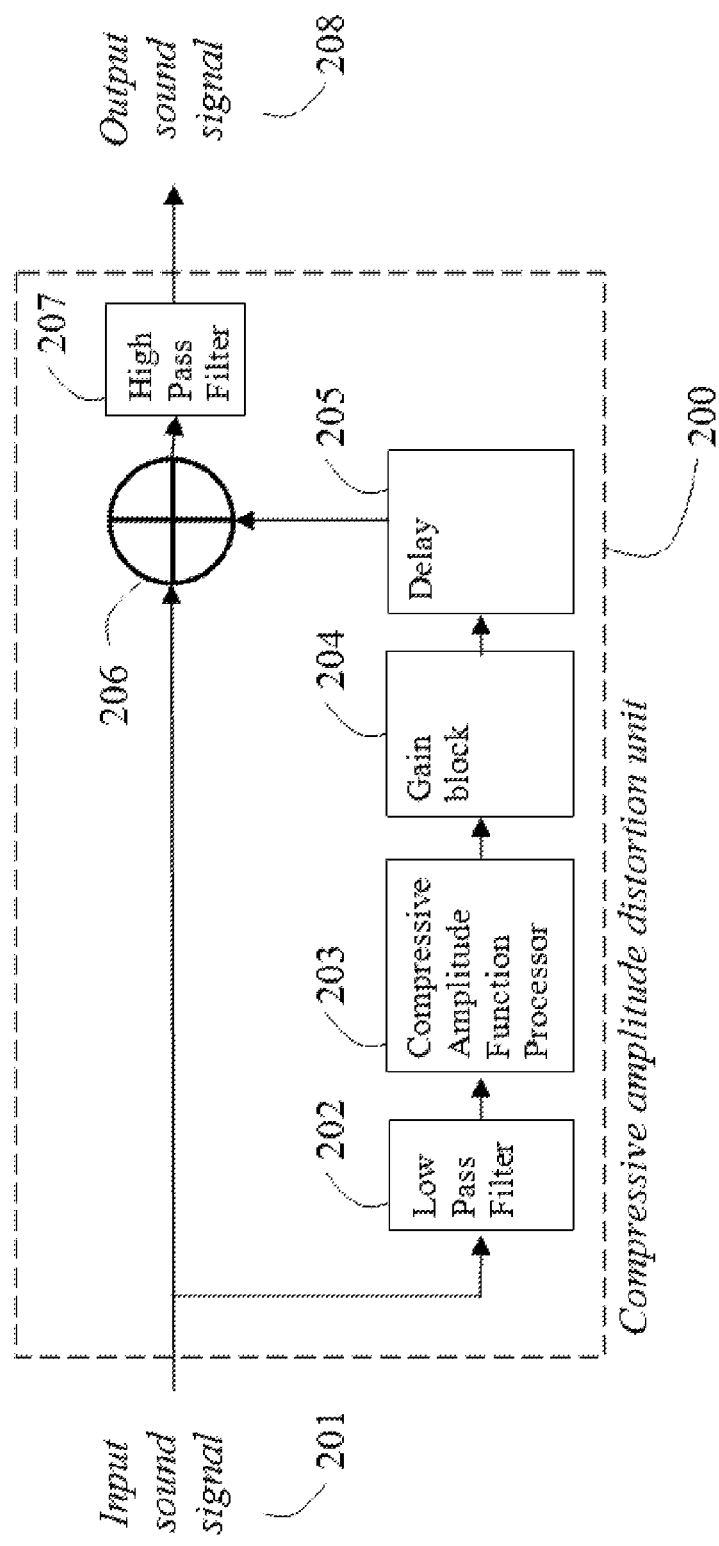
FIG. 5 depicts a block diagram of a compressive amplitude distortion unit according to another aspect of the present invention.

A variant of the aforesaid compressive amplitude distortion unit is shown in FIG. 5. The unit 200 processes an input sound signal 201 and produces an output sound signal 208. The low pass filter 202, compressive amplitude function processor 203, gain block 204, adder 206 and high pass filter 207 perform substantially similar functions as their counterparts 102, 103, 104, 105 and 106, respectively, of the compressive amplitude distortion unit 100. A delay element 205 is introduced for processing the output of the gain block 204. The purpose of the delay element 205 is to delay the residue harmonic components to emulate the muscle response time of the middle ear. The output of the delay element 205 is sent to the adder 206.

For any of the disclosed compressive amplitude distortion units, the input sound signal may optionally contain a DC component, or may not at all. The input sound signal can be represented in a form appropriate for the application. For example, it can be a digital signal represented as a sequence of bits; the sound signal can also be represented as an analog electrical signal; or the sound signal is a physical signal in the form of a sound wave. Accordingly, any of the compressive amplitude distortion units disclosed herein can be implemented as software in digital signal processor(s), or as hardware realized with analog electronic component(s), or as machine by acoustic device(s). Furthermore, in the realization of any of the compressive amplitude distortion units disclosed herein, the Half Loudness Frequency can be made adaptive since the Half Loudness Frequency depends on the loudness perception of the listener. In one example, the Half Loudness Frequency can be made adjustable over a range from 150 Hz to 300 Hz. In a realization of the compressive amplitude function processor, one can optionally choose a middle-ear response that is characterized by a two-sided logarithmic function.

Application of the disclosed compressive amplitude distortion units is illustrated through embodiments shown in FIGS. 6-9.

In practical use, a compressive amplitude distortion unit is a signal processing unit which can be cascaded to any pre-processing or post-processing sound functions such as loudness control, equalization, tone control, amplification, etc. Moreover, it can be used in multi-channel situations such as stereo, 5.1, 6.1, 7.1 channels, etc.

Figure 6:
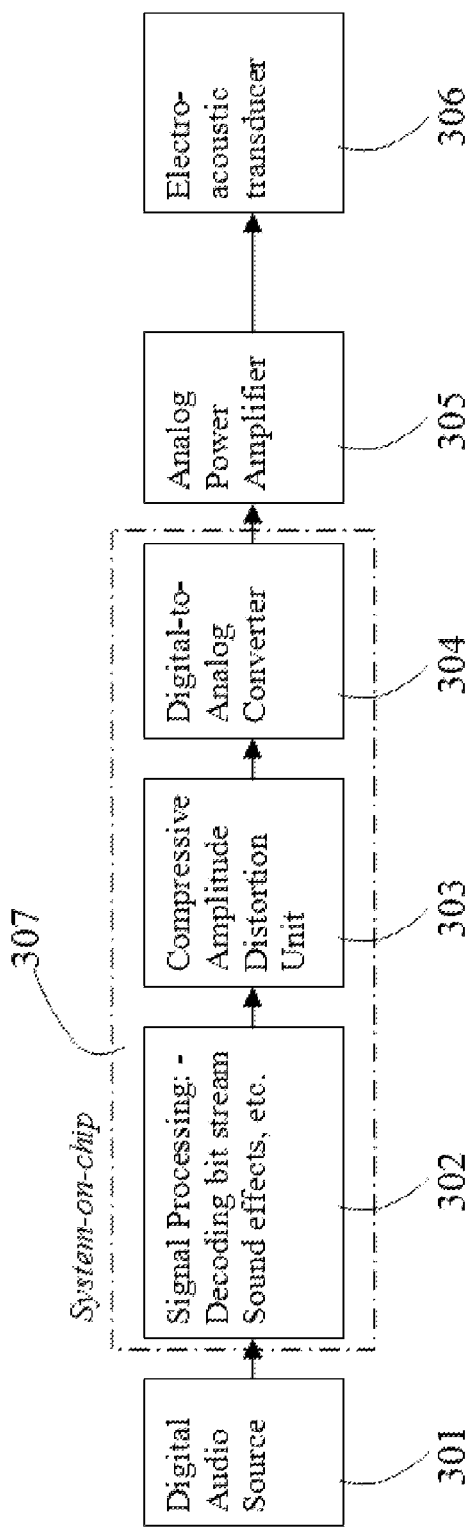
FIG. 6 shows an application of a compressive amplitude distortion unit.

In FIG. 6, a conventional sound system with an analog power amplifier 305 is shown. The digital audio source 301 can be a file of compressed audio or an A/V (audiovisual)/multimedia file, etc., available from CDs, DVDs, mass storage devices, memory cards, the Internet, broadcasting networks, etc. A system-on-chip 307 runs software or uses hardware to process the compressed signal such as decoding the signal, introducing sound effects, etc., as indicated at 302. A compressive amplitude distortion unit 303, realized in digital circuitry, is also implemented inside the chip 307. A digital-to-analog converter 304 is to convert the digital signal into an analog form for amplification by the analog power amplifier 305. The amplifier 305 then drives an electro-acoustic transducer 306 such as a headphone, a loudspeaker, etc., to produce the physical sound for enjoyment by the listener.

Figure 7:
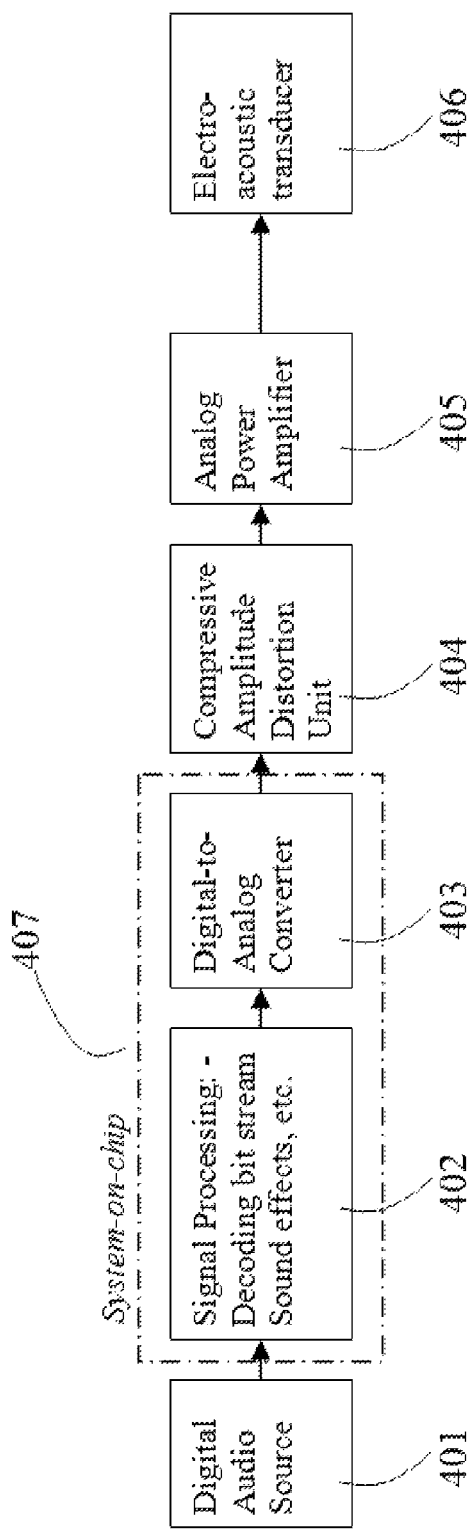
FIG. 7 shows an additional application of a compressive amplitude distortion unit.

FIG. 7 shows a variant of the system of FIG. 6. The digital audio source 401 provides a compressed digital audio signal to a system-on-chip 407 running software or using hardware to process the compressed signal such as decoding the signal, introducing sound effects, etc., as indicated by a block 402. The digital output of the block 402 is fed to a digital-to-analog converter 403 realized in the system-on-chip 407. A compressive amplitude distortion unit 404 is implemented in analog circuitry and processes the output signal from the digital-to-analog converter 403. The output of the compressive amplitude distortion unit 404 is used to drive an analog power amplifier 405. The output of the analog power amplifier 405 is then fed to an electro-acoustic transducer 406 similar to the transducer 306 described above for producing a physical sound.

Figure 8:
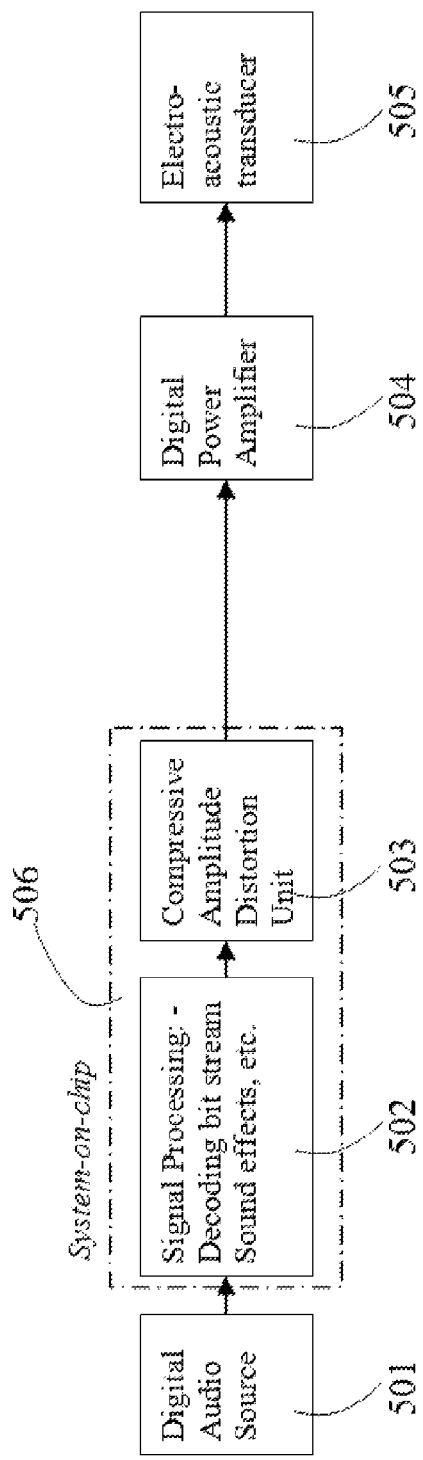
FIG. 8 shows another application of a compressive amplitude distortion unit.

FIG. 8 shows another example. The sound system, which incorporates a compressive amplitude distortion unit 503 in a system-on-chip 506, uses a digital power amplifier 504 so that there is no need to use a digital-to-analog converter. The digital audio source 501 feeds a compressed digital audio signal to the system-on-chip 506 running software or using hardware to process the compressed signal such as decoding the signal, introducing sound effects, etc., as indicated by a block 502. The output of the block 502 is then fed to the compressive amplitude distortion unit 503 that is implemented in digital circuitry. The digital signal output of the system-on-chip 506 can be directly sent to the digital power amplifier 504, the output of which drives an electro-acoustic transducer 505.

Figure 9:
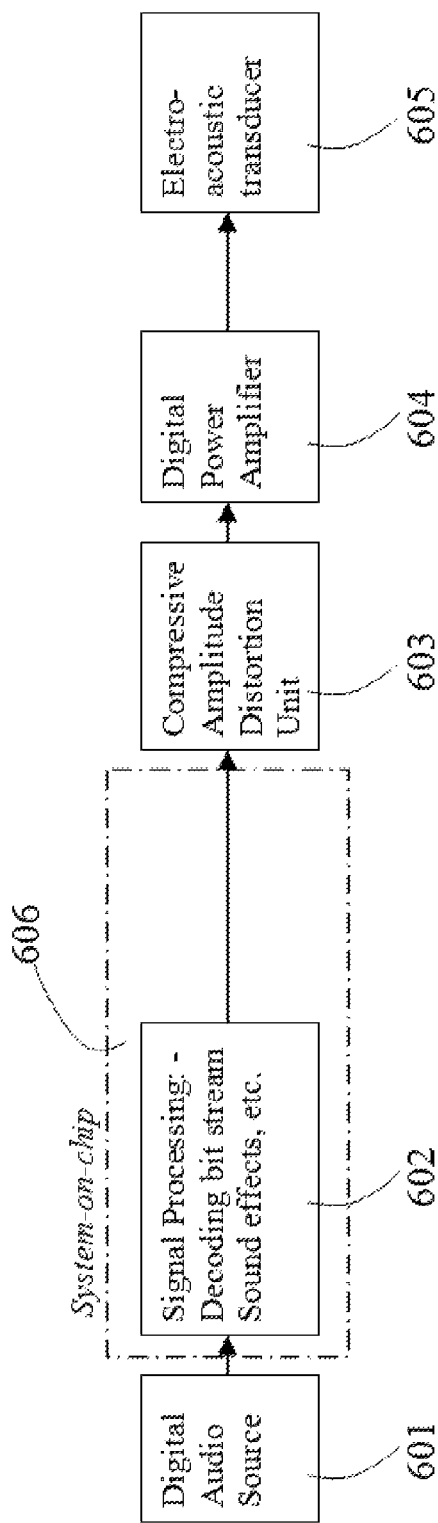
FIG. 9 shows a further application of a compressive amplitude distortion unit.

The system shown in FIG. 9 is a variant of the one depicted in FIG. 8. A compressive amplitude distortion unit 603 is implemented in digital circuitry, and processes the digital signal from a system-on-chip 606. The digital audio source 601 feeds a compressed digital audio signal to the system-on-chip 606 running software or using hardware to process the compressed signal such as decoding the signal, introducing sound effects, etc., as indicated by a block 602. The output of the block 602, which is also the output of the system-on-chip 606, is then fed to the compressive amplitude distortion unit 603. The digital output of the compressive amplitude distortion unit 603 is used to drive a digital power amplifier 604, the output of which is then fed to an electro-acoustic transducer 605 for producing a physical sound.

Further embodiments of the present invention are two anti-piracy methods that utilize the property of the absence of low-frequency signal components in a sound signal after processed by the method disclosed above in the first embodiment.

The first anti-piracy method disclosed herein is to transform a sound signal into a piracy-detectable sound signal such that an unauthorized copy of the piracy-detectable sound signal can be conveniently detected while a human listener can still perceive that reproduced sounds of the sound signal and of the piracy-detectable sound signal are substantially similar. The first anti-piracy method comprises the step of generating the piracy-detectable sound signal from the sound signal by processing the sound signal with the method disclosed above in the first embodiment of this invention. Due to the absence of low-frequency signal components in the piracy-detectable sound signal, a reproduced sound of the unauthorized copy of the piracy-detectable sound signal remains unchanged after bass emphasis processing by a conventional bass-emphasis device, such as a bass-emphasis filter in a radio cassette player. This property enables convenient detection of the unauthorized copy.

The second anti-piracy method disclosed herein is for presenting a sound signal to an analog output of a device that is capable of sending out at least one analog sound signal, such as a portable music player and a multimedia player, while discouraging people to make an unauthorized copy of the sound signal through recording a signal produced at such analog output. The signal produced at such analog output is hereinafter referred to as an analog-output signal. In this method, the first step is to generate a piracy-detectable sound signal from the sound signal by the first anti-piracy method disclosed above. Since the piracy-detectable sound signal that is so generated can be represented in any one form, such as a digital form, an analog form, or a physical sound wave form, this piracy-detectable sound signal is transformed into an equivalent analog form. In a case that the piracy-detectable sound signal generated by the first anti-piracy method is already in an analog form, transformation into an equivalent form means that the equivalent analog form is simply this piracy-detectable sound signal. Then the equivalent analog form of the piracy-detectable sound signal is presented to the analog output of the device, resulting in the analog-output signal. Since the analog-output signal does not have any low-frequency signal components, attempts to further enhance the bass of this signal by a bass-enhancement apparatus, such as a bass-emphasis filter, are rendered failed. Failure for further bass enhancement can be viewed by people who aim at enjoying superior music as a disadvantage or even a penalty to themselves, thus discouraging people to record the analog-output signal for making an unauthorized copy.

The present invention may be embodied in other specific forms without departing from the spirit or essential characteristics thereof. The present embodiment is therefore to be considered in all respects as illustrative and not restrictive. The scope of the invention is indicated by the appended claims rather than by the foregoing description, and all changes that come within the meaning and range of equivalency of the claims are therefore intended to be embraced therein.

What is claimed is:

1. A device for processing an input sound signal to enhance aural perception of low-frequency signal components in the input sound signal, whereby an output sound signal of the device incorporates residue harmonics of the low-frequency signal components, and the low-frequency signal components are absent from the output sound signal but a human listener who listens to the output sound signal still psychologically perceive the presence of such components due to the presence of the residue harmonics, the device comprising:
    a low pass filter for extracting the low-frequency signal components of the input sound signal, the low-frequency signal components comprising signal components substantially from zero Hz to a Half Loudness Frequency, the low pass filter generating a low-pass signal;
    a compressive amplitude function processor for generating a harmonics-containing signal as output based on the low-pass signal as input, an input-output relationship of the compressive amplitude function processor being a nonlinear function emulating the middle-ear response of a human being, whereby the residue harmonics of the low-frequency signal components are generated and form part of the harmonics-containing signal;
    a gain block for providing gain to the harmonics-containing signal, the gain block producing a scaled harmonics-containing signal, the gain being selected such that the signal strength of the scaled harmonics-containing signal is in the same range as that of the initial low-pass signal;
    an adder for adding the input sound signal and the scaled harmonics-containing signal, generating an adder output; and
    a high pass filter for generating the output sound signal by extracting the frequency components of the adder output substantially above the Half Loudness Frequency, thereby removing the low frequency signal components in the output sound signal while still including the residue harmonics.

2. The device of claim 1, wherein the input sound signal is represented as either an analog electrical signal, a digital signal, or a physical sound wave.

3. The device of claim 1, wherein the input sound signal includes a DC component.

4. The device of claim 1, wherein the middle-ear response is characterized by a two-sided logarithmic function.

5. The device of claim 1, wherein the Half Loudness Frequency is adjustable.

6. The device of claim 5, wherein the range that the Half Loudness Frequency is adjustable is from 150 Hz to 300 Hz.

7. The device of claim 1, further comprising a delay element for introducing a delay to the scaled harmonics-containing signal supplied to the adder.

8. The device of claim 7, wherein the input sound signal is represented as either an analog electrical signal, a digital signal, or a physical sound wave.

9. The device of claim 7, wherein the input sound signal includes a DC component.

10. The device of claim 7, wherein the middle-ear response is characterized by a two-sided logarithmic function.

11. The device of claim 7, wherein the Half Loudness Frequency is adjustable.

12. The device of claim 11, wherein the range that the Half Loudness Frequency can be adjusted is from 150 Hz to 300 Hz.

13. A method for enhancing the perceptibility of low-frequency signal components of an input sound signal, the method comprising:
    extracting the low-frequency signal components of the input sound signal to yield a low-pass signal;
    processing the low-pass signal by a nonlinear function to produce an output signal of the nonlinear function, the nonlinear function having an input-output relationship emulating the middle-ear response of a human being, the middle-ear response being characterized by a two-sided logarithmic function, such that residue harmonics of the low-frequency signal components are generated;
    adjusting the amplitude of the output signal of the nonlinear function such that the power of the signal after adjustment is in the same range as the power of the low-pass signal;
    adding the amplitude-adjusted signal to the input sound signal to give a first sound signal having the residue harmonics; and
    filtering out the low-frequency signal components from the first sound signal, thereby generating a resultant signal with enhanced perceptibility of the low-frequency signal components due to the presence of the residue harmonics.

14. The method of claim 13, wherein the input sound signal is represented in the form of either an analog electrical signal, a digital signal, or a physical sound wave.

15. The method of claim 13, wherein the input sound signal includes a DC component.

16. An anti-piracy method for transforming an input sound signal into a piracy-detectable sound signal to allow convenient detection of an unauthorized copy of the piracy-detectable sound signal while a human listener still perceives that reproduced sounds of the input sound signal and of the piracy-detectable sound signal are substantially similar, the anti-piracy method comprising:
    generating the piracy-detectable sound signal by the method of claim 13 in which the resultant signal becomes the piracy-detectable sound signal;
    whereby a reproduced sound of the unauthorized copy remains substantially unchanged after bass emphasis processing so that the unauthorized copy is conveniently detectable.

17. An anti-piracy method for presenting an input sound signal to an analog output of a device that is capable of sending out at least one analog sound signal, and for discouraging people to make an unauthorized copy of the input sound signal through recording an analog-output signal present at such analog output, the anti-piracy method comprising:
    generating a piracy-detectable sound signal from the input sound signal by the method of claim 16;
    obtaining an equivalent analog form of the piracy-detectable sound signal, wherein:
        (a) when the piracy-detectable sound signal that is generated is already represented in an analog form, the equivalent analog form is the piracy-detectable sound signal represented in the analog form; and (b) when the piracy-detectable sound signal that is generated is represented in one form not the analog form, the equivalent analog form is obtained by transforming the piracy-detectable sound signal represented in said one form into the equivalent analog form; and;

presenting the equivalent analog form of the piracy-detectable sound signal to the analog output of the device, such that the equivalent analog form of the piracy-detectable sound signal becomes the analog-output signal;

whereby the absence of low-frequency signal components in the analog-output signal renders attempts to further enhance the bass of the analog-output signal by a bass-enhancement apparatus failed, such failure for further bass enhancement discouraging people to record the analog-output signal for making the unauthorized copy.

\* \* \* \* \*